(12) United States Patent
Wirth (10) Patent No.: US 9,799,544 B2
(45) Date of Patent: Oct. 24, 2017

(54) ROBOT ASSEMBLIES, SUBSTRATE PROCESSING APPARATUS, AND METHODS FOR TRANSPORTING SUBSTRATES IN ELECTRONIC DEVICE MANUFACTURING

(71) Applicant: Applied Materials, Inc., Santa Clara, CA (US)

(72) Inventor: Paul Z. Wirth, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 248 days.

(21) Appl. No.: 14/921,806

(22) Filed: Oct. 23, 2015

(65) Prior Publication Data
US 2017/0117171 A1    Apr. 27, 2017

(51) Int. Cl.
*H01L 21/677* (2006.01)
*B25J 5/02* (2006.01)
*H01L 21/67* (2006.01)

(52) U.S. Cl.
CPC .......... *H01L 21/67706* (2013.01); *B25J 5/02* (2013.01); *H01L 21/67161* (2013.01); *H01L 21/67196* (2013.01); *H01L 21/67724* (2013.01)

(58) Field of Classification Search
CPC . B25J 5/02; B25J 9/0009; B25J 9/0027; B25J 9/042; B25J 9/104; B25J 9/126; B25J 18/04; B60L 13/04; H01L 21/67173; H01L 21/67706; H01L 21/67724; H01L 21/67742; H01L 21/67766; Y10S 414/135; Y10S 901/15; Y10S 901/17; Y10S 901/21; Y10T 74/20305; Y10T 74/20323
USPC ......... 74/490.01, 490.04; 414/226.05, 744.5, 414/935; 901/15, 17, 21
See application file for complete search history.

(56) References Cited

U.S. PATENT DOCUMENTS

| 7,688,017 B2 | 3/2010 | Hudgens |
| 7,927,062 B2 | 4/2011 | Rice et al. |
| 8,016,542 B2 | 9/2011 | Cox et al. |
| 8,061,232 B2 | 11/2011 | Kroetz et al. |
| 8,264,187 B2 | 9/2012 | Laceky et al. |

(Continued)

FOREIGN PATENT DOCUMENTS

| CN | 102709221 A | 10/2012 |
| WO | WO 97-10079 | 3/1997 |
| WO | WO 2015/057959 | 4/2015 |

OTHER PUBLICATIONS

International Search Report and Written Opinion of International Application No. PCT/US16/54093 dated Dec. 14, 2016.

*Primary Examiner* — Anna M Momper
*Assistant Examiner* — Brendan P Tighe
(74) *Attorney, Agent, or Firm* — Dugan & Dugan, PC (57) ABSTRACT

A robot assembly allowing remote actuation of a carriage supported robot. The robot assembly includes a track, a carriage moveable along the track, and a robot mounted to the carriage. The robot includes at least a first arm, and a first driven member coupled to the first arm. The robot assembly further includes a drive assembly having a first driving member, a first transmission member coupled to the first driving member and the first driven member, and a first drive motor coupled to the first driving member. The first drive motor is configured to move the first driving member causing remote rotation of the first driven member and rotation of the first arm. Substrate processing apparatus and methods of transporting a substrate within a substrate processing apparatus are also provided, as are numerous other aspects.

20 Claims, 8 Drawing Sheets

(56) References Cited

U.S. PATENT DOCUMENTS

| | | |
|---|---|---|
| 8,692,500 B2 | 4/2014 | Laceky et al. |
| 8,777,547 B2 | 7/2014 | Kremerman et al. |
| 8,784,033 B2 | 7/2014 | Kremerman et al. |
| 8,960,099 B2 | 2/2015 | Hosek et al. |
| 2010/0280654 A1 | 11/2010 | Rice et al. |
| 2010/0329827 A1 | 12/2010 | Hoey et al. |
| 2011/0150608 A1 | 6/2011 | Choi et al. |
| 2013/0115028 A1 | 5/2013 | Kremerman et al. |
| 2013/0149076 A1 | 6/2013 | Cox et al. |
| 2013/0272823 A1 | 10/2013 | Hudgens et al. |
| 2014/0010625 A1 | 1/2014 | Hudgens et al. |
| 2014/0150592 A1 | 6/2014 | Kremerman |
| 2014/0154038 A1 | 6/2014 | Hudgens et al. |
| 2014/0271055 A1 | 9/2014 | Weaver et al. |
| 2014/0286736 A1 | 9/2014 | Kremerman et al. |
| 2014/0286741 A1 | 9/2014 | Kremerman et al. |
| 2015/0190933 A1 | 7/2015 | Kremerman |

ROBOT ASSEMBLIES, SUBSTRATE PROCESSING APPARATUS, AND METHODS FOR TRANSPORTING SUBSTRATES IN ELECTRONIC DEVICE MANUFACTURING

FIELD

The present invention relates to electronic device manufacturing, and more specifically to robot assemblies, substrate processing apparatus, and methods of operating robots for transporting substrates.

BACKGROUND

Conventional electronic device manufacturing systems may include multiple process chambers and one or more load lock chambers. Such process chambers and one or more load lock chambers may be included in a cluster tool, for example, where substrates may be transported between the respective process chambers and the one or more load lock chambers. These systems may employ one or more robots to move the substrates between the various chambers, and the one or more robots may reside in the transfer chamber in some embodiments.

During such movements, a substrate may be supported on an end effector (sometimes referred to as a "blade") of the one or more robots. Efficient and precise transport of substrates between the various chambers may be desired for fast system throughput, thereby possibly lowering overall operating costs.

Accordingly, robot assemblies, substrate processing apparatus, and methods having capability for efficient and precise movement of the substrates within transfer chambers are desired.

SUMMARY

In one aspect a robot assembly is provided. The robot assembly includes a track, a carriage moveable along the track, a robot mounted to the carriage, the robot including at least a first arm, and a first driven member coupled to the first arm, and a drive assembly including a first driving member, a first transmission member coupled to the first driving member and the first driven member, the first transmission member extending along a length of the track, and a first drive motor coupled to the first driving member, the first drive motor configured to move the first driving member causing rotation of the first driven member and rotation of the first arm.

In another aspect, a substrate processing apparatus is provided. The substrate processing apparatus includes a transfer chamber, a plurality of process chambers arranged along a length of the transfer chamber, a robot assembly configured to move substrates to and from the process chambers, the robot assembly comprising: a track, a carriage moveable along the track, a robot mounted to the carriage, the robot including at least a first arm, and a first driven member coupled to the first arm, a drive assembly including a first driving member, a first transmission member coupled to the first driving member and the first driven member, the first transmission member extending along a length of the track, and a first drive motor coupled to the first driving member, the first drive motor configured to move the first driving member causing rotation of the first driven member and rotation of the first arm.

In another aspect, a method of transporting a substrate within a substrate processing apparatus is provided. The method includes providing robot assembly including a carriage moveable along a track, a robot mounted to the carriage and including at least a first arm, a first driven member coupled to the first arm, a drive assembly including a first driving member, a first transmission member coupled to the first driving member and the first driven member, the first transmission member extending along a length of the track, and a first drive motor coupled to the first driving member, and operating the first drive motor to rotate the first driving member causing rotation of the first driven member, rotation of the first arm, and motion of the substrate.

Still other aspects, features, and advantages of the present invention may be readily apparent from the following detailed description by illustrating a number of example embodiments and implementations, including the best mode contemplated for carrying out the present invention. The present invention may also be capable of other and different embodiments, and its several details may be modified in various respects, all without departing from the scope of the present invention. Accordingly, the drawings and descriptions are to be regarded as illustrative in nature, and not as restrictive. The invention is to cover all modifications, equivalents, and alternatives falling within the scope of the appended claims.

BRIEF DESCRIPTION OF THE DRAWINGS

The invention will be better understood by referring to the detailed description taken in conjunction with the following drawings.

DESCRIPTION

Electronic device manufacturing tools may utilize one or more robots for accomplishing movement of substrates between locations within the tool. For example, one or more robots may reside in a transfer chamber and may be used to transfer one or more substrates (e.g., silicon wafers, glass plates, masks, and the like) between various processing chambers and/or one or more load lock chambers of the processing tool. In many instances, such process and/or one or more load lock chambers may be operated under a vacuum. Accordingly, robot assemblies may be positioned in, and be able to operate within, a vacuum environment. In some cases, the robot assembly may be designed to have articulation capability to be able to access non-radial chambers (e.g., offset chambers, i.e., those offset from the shoulder axis of the robot). Moreover in order to reduce an overall size of the transfer chamber, robots having a small operating envelope may be desirable.

In some processing tools, the transfer chamber may be elongated, having several process chambers (e.g., up to 6 or more) arranged along a length thereof. In some embodiments, multiple robots may be employed in the transfer chamber and may be configured to hand off substrates to a handoff location or to each other. However, the additional robot adds an additional system expense as well as additional control requirements.

In accordance with one or more embodiments of the invention, a robot assembly is provided with an ability to service multiple chambers arranged along a length of an elongated transfer chamber, for example, with a single robot assembly. In particular, the robot assembly includes a carriage-mounted robot that is moveable along a track arranged in the elongated transfer chamber. The carriage and arms of the robot are moved remotely by a drive assembly. Drive assembly includes driving members (e.g., pulleys) and the carriage may include driven members (e.g., pulleys). Transmission members (e.g., belts) coupled to the driving and driven members and allow for remote actuation of the carriage-mounted robot.

Further details of example embodiments of robot assemblies, substrate processing apparatus, and method of transporting a substrate within a substrate processing apparatus are described below with reference to FIGS. 1-8.

Figure 1:
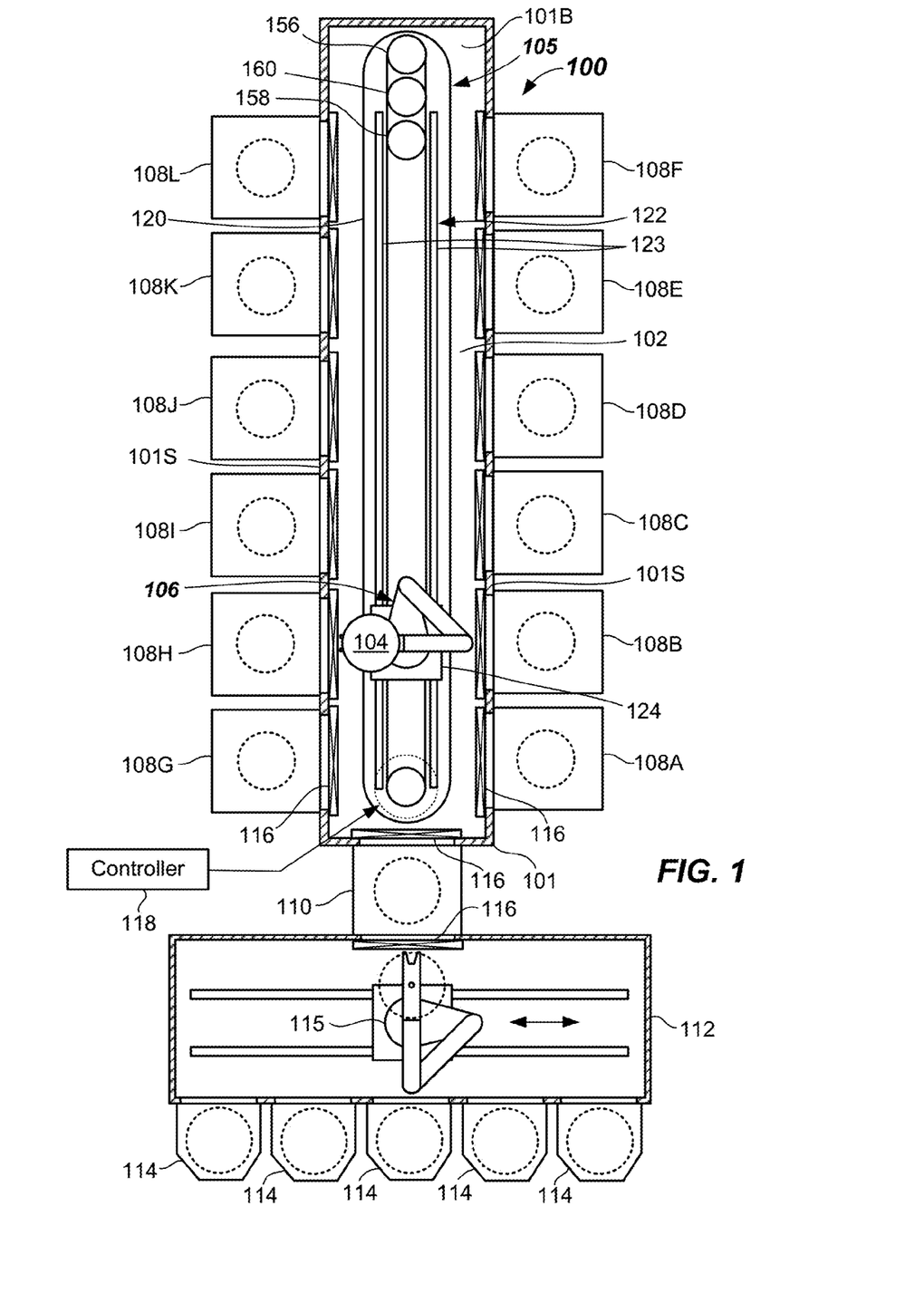
FIG. 1 illustrates a top plan view of a substrate processing apparatus including a robot assembly having a carriage-mounted robot that is remotely driven according to one or more embodiments.

FIG. 1 illustrates a top plan view of an example embodiment of a substrate processing apparatus 100 (with lid removed for illustration purposes) including a robot assembly 105 according to one or more embodiments of the present invention. The substrate processing apparatus 100 includes a mainframe housing 101 having walls defining a transfer chamber 102 that is elongated, i.e., having a length greater than a width thereof. Walls include side walls 101S, bottom wall 101B, and a top wall formed by the top lid (removed for illustration purposes). The transfer chamber 102 may be sealed and may be operated to include a vacuum in some embodiments. The robot assembly 105 in accordance with another feature of the invention may be at least partially housed within the transfer chamber 102.

In particular, the robot assembly 105 may include a robot 106 including one or more moveable arms housed in the transfer chamber 102. As will be apparent, the drive motor of a drive assembly of the robot 106 may reside outside of the transfer chamber 102. Accordingly, control and power cables passing to the drive motor assembly may be advantageously located outside of the vacuum environment.

The robot 106 may be configured to place or extract substrates 104 to and from destinations via operation of the robot 106, which is described fully below herein. Substrates 104 as used herein shall mean articles used to make electronic devices or circuit components, such as silicon-containing wafers, thinned wafers, silicon wafer subassemblies, silicon wafer packages and assemblies such as through silicon via (TSV) and wafer level packaging (WLP), masked wafers, diced wafers, sapphire wafers and/or wafer carriers, glass plates, glass masks, glass panels, or the like. The destinations may be process chambers 108A-108L that are coupled to the mainframe housing 101 and are accessible from the transfer chamber 102 by the robot 106. The process chambers 108A-108 may be provided in a side-by-side arrangement along the elongated length of the transfer chamber 102 and may have facets that are generally parallel in some embodiments. The dotted circles in each of the process chambers 108A-108L denote a pedestal or processing location for the substrates 104 within the respective ones of the process chambers 108A-108L. Optionally, the destination may be one or more load lock chambers 110, which may be coupled to the transfer chamber 102, such as at a longitudinal end thereof.

Process chambers 108A-108L may be adapted to carry out any number of processes on the substrates 104, such as deposition, oxidation, nitration, etching, polishing, cleaning, lithography, or the like. Other processes may be carried out therein. The one or more load lock chamber 110 may be configured to interface with, and receive substrates 104 from, a factory interface 112 (otherwise referred to as a front end equipment module (EFEM)), and/or provide substrates 104 to a factory interface 112 after processing thereof. For example, the one or more load lock chambers 110 may receive one or more substrates 104 from substrate carriers 114 that may be docked at load ports of the factory interface 112. Substrates 104 may be transferred between the substrate carriers 114 and the one or more load lock chambers 110 by a factory interface robot 115 operable in the factory interface 112. The transfer may take place in any sequence or direction.

Each of the process chambers 108A-108L and one or more load lock chambers 110 may include slit valves 116 (a few labeled) at their ingress/egress, which may be adapted to open and close when placing or extracting the substrates 104 to and from process chambers 108A-108L and the one or more load lock chambers 110. Slit valves 116 may be of any suitable conventional construction.

In the depicted embodiment, the motion of the various moveable components (e.g., arms) of the robot assembly 105 may be controlled by suitable commands from a controller 118, as will be apparent from the following. Controller 118 may include a suitable processor, memory, one or more power modules, and electronic components, such as drivers, D/A converters, amplifiers or other electronic components capable of producing drive signals to accomplish motion of the drive motors of the drive assembly.

In more detail, the robot assembly 105 may include a base 120 including a track 122. Base 120 may be a plate and may fasten to the housing 101, such as to the bottom wall 101B (e.g., by bolts, screws, or the like), or may be integral with the bottom wall 101B in some embodiments. If base 120 is a separate element, base 120 may be sealed to the bottom wall 101B. Base 120 may function to support various components of the robot assembly 105.

The robot assembly 105 includes a carriage 124 that is moveable and translatable, in a back and forth manner, along the track 122 so as to deliver the robot 106 to various longitudinal positions along the transfer chamber 102 thus allowing the substrates 104 to be placed into or removed from one or more of the process chambers 108A-108L or load lock chambers 110. Track 122 may include one or more linear rails 123 or other features onto which the carriage 124 may be mounted for linear translational motion. In the depicted embodiment, the carriage 124 may be attached to one or more linear bearings 325 (FIG. 3) that ride on the one or more rails 123 of track 122 and provide relatively low friction translational motion of the carriage 124 in a longitudinal direction along the elongated length of the mainframe housing 101. Linear bearings 325 may be sliding contact bearings, rolling element bearings (roller or ball type), hydrostatic or air linear motion bearings, or even magnetic motion linear bearings. In the depicted embodiment, two laterally-spaced rails are provided and linear ball bearings may be provided. However, other forms of a track 122 and linear bearing or slide members providing smooth linear translation of the carriage 124 may be used.

Figure 2:
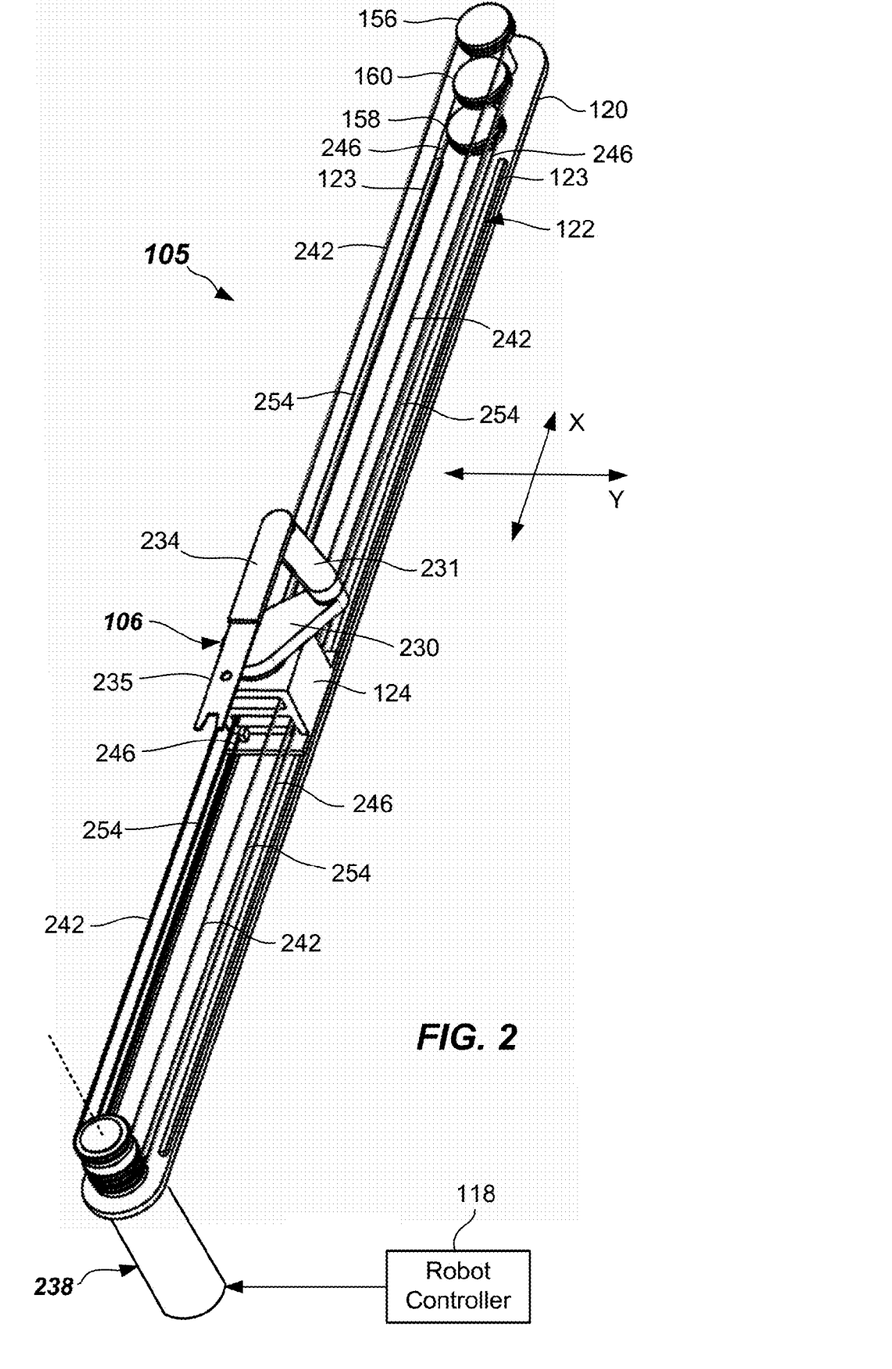
FIG. 2 illustrates an isometric view of components of a robot assembly according to embodiments.
Figure 3:
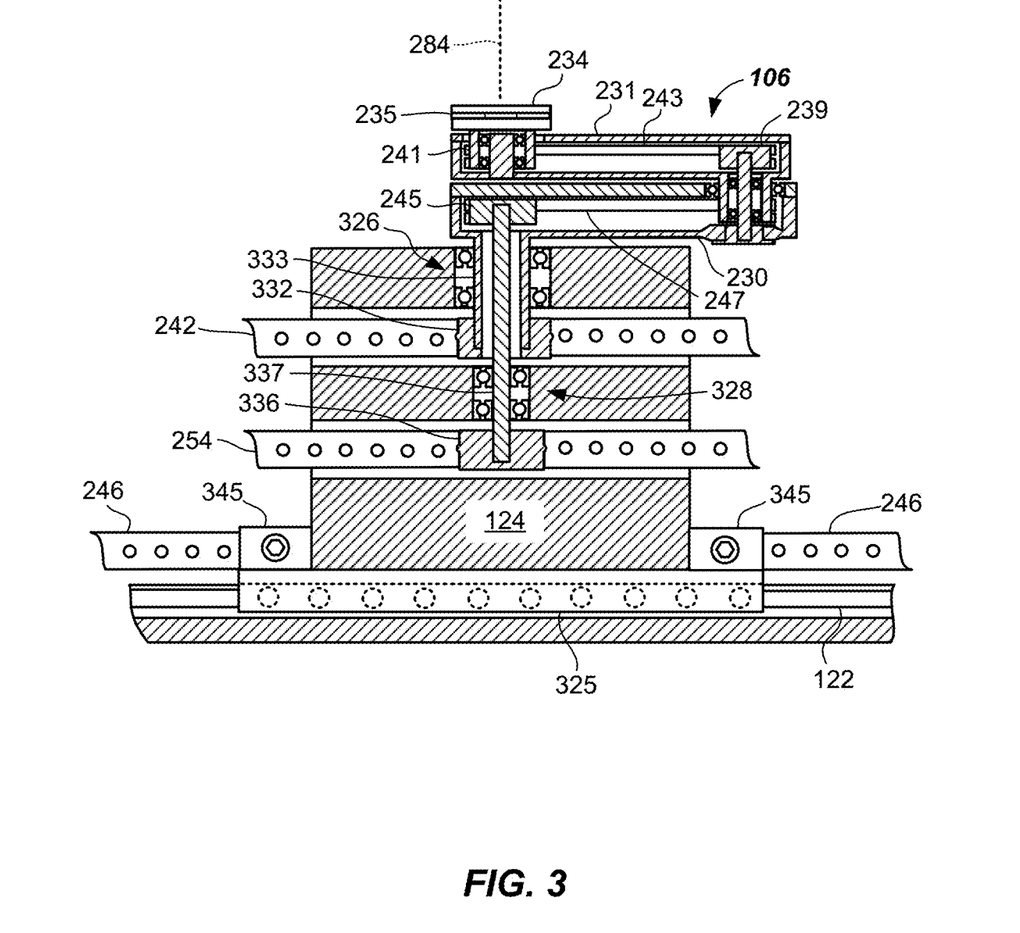
FIG. 3 illustrates a cross-sectioned partial side view of a robot assembly according to one or more embodiments.

Now referring to FIGS. 2 and 3, the robot 106 is mounted to the carriage 124 through the use of suitable bearings, such as first bearing 326 and second bearing 328. Any suitable bearing such as sealed roller ball bearing, sealed needle bearing, or other bearing type may be used. The robot 106 may include at least a first arm 230 (e.g., an upper arm) that is rotatable relative to the carriage 124 about a shoulder axis 284, such as +/−360 degrees or more. Robot 106 may also include other arms, such as second arm 231 and third arm 234. An end effector 235 may be coupled to the third arm 234 and configured to carry a substrate 104 thereon. In some embodiments, the coupling of the end effector 235 may be accomplished by making the third arm 234 integral with the end effector 235. The robot 106 may be a selective compliance articulated robot arm (SCARA) robot. Other types of multi-arm robots may be used. In some embodiments, independently and remotely controlled arms may be provided.

As best shown in FIG. 3, robot 106 may include a first driven member 332 coupled to the first arm 230 and configured to cause rotation of the first arm 230 via rotation of first driven shaft 333. Robot 106 may include a second driven member 336 coupled to the second arm 231 and configured to cause rotation of the second arm 231 via rotation of second driven shaft 337. The third arm 234 may be rotated based upon a kinematic connection caused by fixing the third arm driving member 239 to the first arm 230 and coupling the third arm pulley 241 with one or more drive belts 243 (e.g., metal belts).

Figure 4:
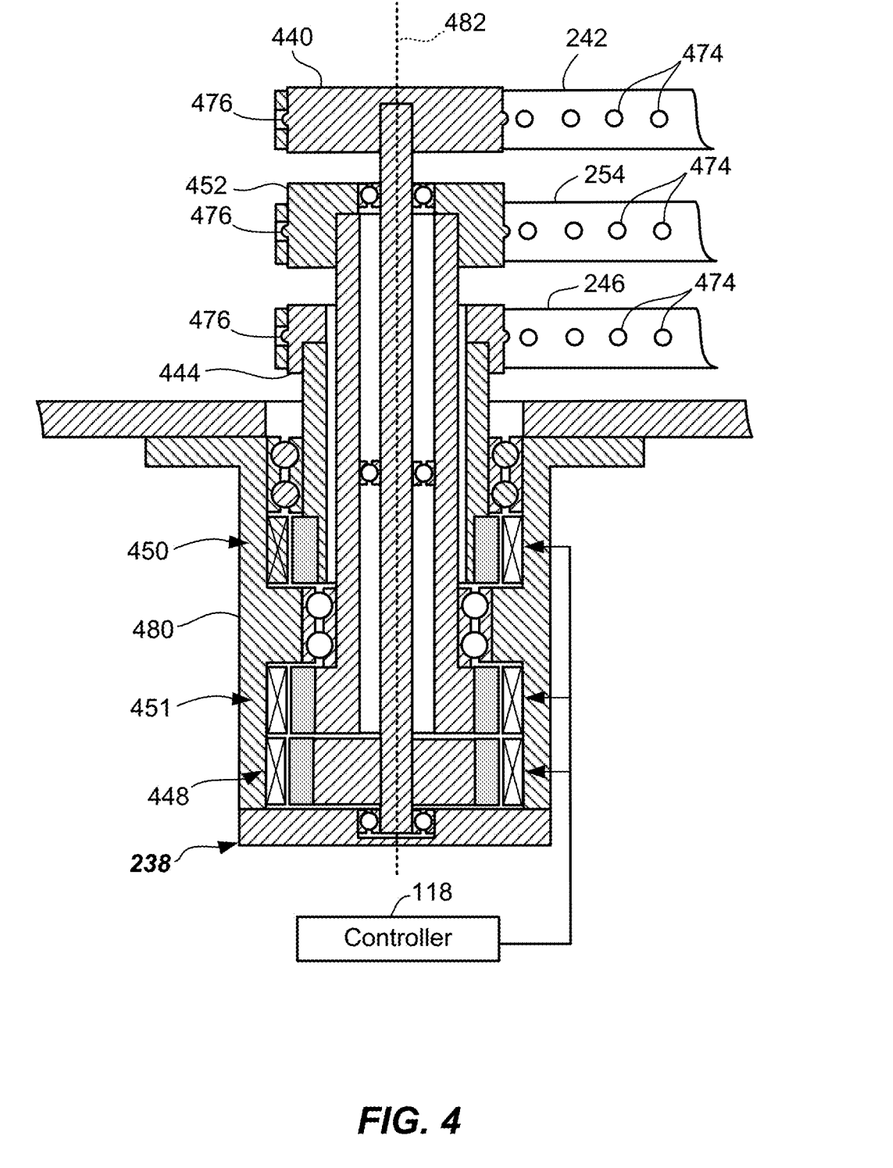
FIG. 4 illustrates a cross-sectioned side view of a drive assembly of a robot assembly according to one or more embodiments.

Referring now to FIGS. 2 through 4, the robot assembly 105 further includes a drive assembly 238 including a first driving member 440, a first transmission member 242 coupled to the first driving member 440 and also to the first driven member 332. The first transmission member 242 extends along a length of the track 122, and may take the form of a belt (e.g. an endless belt). The drive assembly 238 may further include a first drive motor 448 coupled to the first driving member 440, wherein the first drive motor 448 is configured to rotate the first driving member 440 causing motion of the first transmission member 242 and rotation of the first driven member 332 and thus causing rotation of the first arm 230 from a remote location.

Robot assembly 105 further includes a second driving member 444 and a second transmission member 246 coupled to the second driving member 444. The second transmission member 246 may extend along a length of the track 122 may be coupled to the carriage 124 at multiple locations. Second transmission member 246 is configured to move the carriage 124 along the track 122 upon rotation of the second driving member 444. The second transmission member 246 may be coupled to the carriage 124 via any suitable fastening mechanism, such as bolt or screw fastening the respective ends of the second transmission member 246 to attachment members 345 that may be on the sides of the carriage 124 (See FIG. 3). The drive assembly 238 may include a second drive motor 450 coupled to the second driving member 444, and configured to move the carriage 124 along the track 122 upon causing rotation of the second driving member 444.

The robot assembly 105 may be configured to include the second driven member 336 coupled to the second arm 231, a third driving member 452, and a third transmission member 254 coupled between the third driving member 452 and the second driven member 336. As before, the third transmission member 254 may extend along the length of the track 122. The drive assembly 238 may include a third drive motor 451 coupled to the third driving member 452, and configured to cause rotation of the third driving member 452 and thus cause motion of the second transmission member 246, which in turn will rotate the second driven member 336 and rotate the second arm 231 and also the third arm 234. The motion of a SCARA robot will not be described further herein. However, the rotation of the second driven member 336 drives second arm driving pulley 245 which drives second arm 231 via one or more drive belts 247. Belts 243, 247 may comprise metal belts as are known in SCARA robots.

The drive motors 448, 450, 451 of the drive assembly 238 may couple via nested shafts to the driving members 440, 444, and 452, respectively. One or more support bearings may be provided between the motor housing 480 and the respective shafts, between the shafts, or both. The support bearings may be any suitable member for allowing rotation and restraining vertical motion of the shafts along the drive axis 482. The support bearings may be sealed ball bearings, for example. Other types of bearings or bushings may be used.

In the depicted embodiments, the drive motors 448, 450, 451 may be electric motors having a rotor (e.g., including a series of magnets) that may be attached to the respective shafts and stators (e.g., a series of windings) that may be secured or attached to the motor housing 480, for example. In particular, in some embodiments, the stators may be provided in an area which is not under a vacuum, under a lesser vacuum than the transfer chamber 102, or at least physically separated from the transfer chamber 102. Any suitable three-axis drive assembly may be used in this embodiment. Providing the motors 448, 450, 451 remotely outside of the transfer chamber 102 eliminates wiring that is conventionally carried by the carriage 124, and places one source of particles outside of the transfer chamber 102.

Although a three axis system is described, it should be understood that additional functionality may be added by adding additional drive motors and driven members, idler members, and driven members. For example, as such, independent motion of an upper arm, forearm, and wrist of a robot 106 may be accomplished. Optionally or additionally, by adding an additional drive motor, more than one end effector may be provided and remotely controlled in some embodiments.

Figure 5:
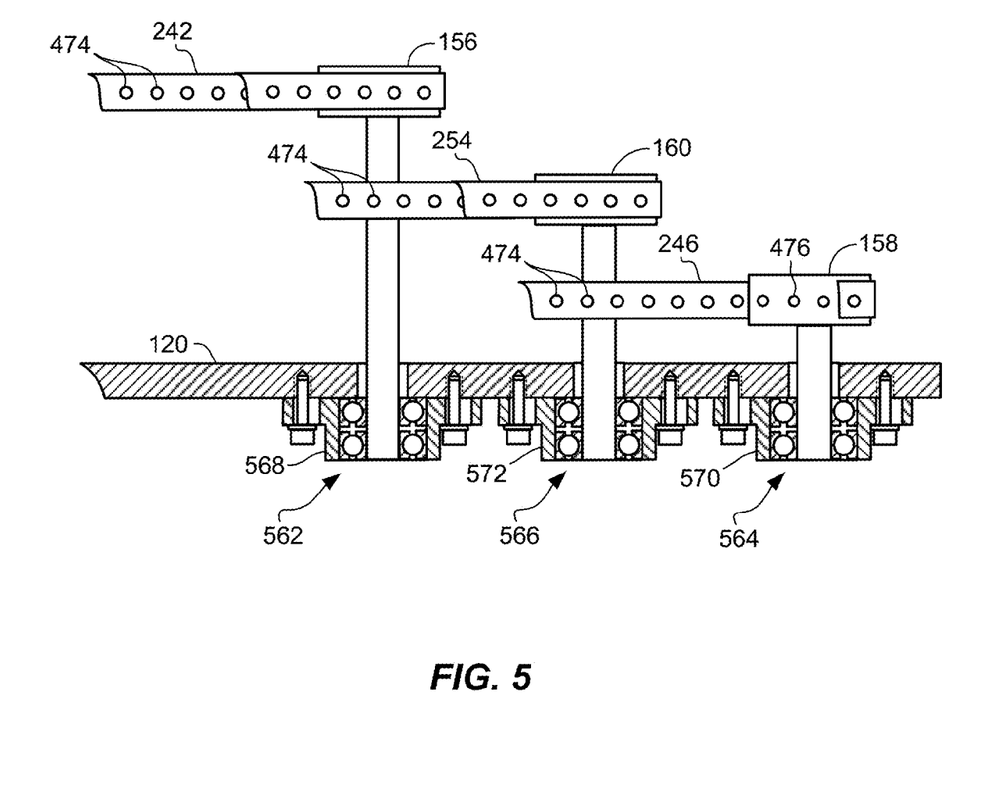
FIG. 5 illustrates a cross-sectioned side view of an idler pulley assembly of a robot assembly according to one or more embodiments.

As shown in FIG. 5, the robot assembly 105 may further include one or more idler assemblies 562, 564, 566 including idler members 156, 158, 160 to allow for support of the transmission members (e.g., first transmission member 242, second transmission member 246, and third transmission member 254) at a second end of the track 122 opposite from the drive assembly 238. A first idler member 156 of the first idler assembly 562 may be coupled to the first transmission member 242, and a second idler member 158 coupled to the second transmission member 246. The robot assembly 105 may further include a third idler member 160 coupled to the third transmission member 254.

In one or more embodiments of the robot assembly 105, the drive assembly 238 may be coupled to a first end of the base 120, and at least two idler pulleys (e.g., idler members 156, 160) may be coupled to a second end of the base 120 opposite the first end. In the depicted embodiment shown in FIG. 5, one or more, and in some embodiments, all of the idler members 156, 158, 160 may be adjustable in position along the length of the track 122, so that tension of the transmission members 242, 246, 254 may be adjusted.

In more detail, the robot assembly 105 may include a first idler assembly 562 including the first idler member 156 rotatably mounted to a first idler housing 568, wherein the first idler member 156 is in contact with the first transmission member 242 to provide support thereof. The first idler housing 568 may be fastenable to the base 120 at a first longitudinal position along the base 120.

Likewise, a second idler member 158 may be rotatably mounted to a second idler housing 570 and may be provided in contact with the second transmission member 246. Similarly, the second idler housing 570 may be fastenable to the base 120 at a second longitudinal position spaced from the first longitudinal position.

In some embodiments, a third idler assembly 566 may be provided including a third idler member 160 rotatably mounted to a third idler housing 572 and in contact with a third transmission member 254. Like the others, the third idler housing 572 may be fastenable to the base 120 at a longitudinal position spaced between the first longitudinal position and the second longitudinal position.

In some embodiments, one or more of the idler assemblies 562, 564, 566 may include longitudinal position adjustment capability. This adjustment capability allows for tension of one or more of the transmission members 242, 246, 254 to be adjusted. Any suitable means for adjusting may be provided, such as longitudinally-oriented slots formed in the respective idler housings 568, 570, 572 that are configured receive bolts or screws therein, wherein the slots allow for position adjustment of about +/−12 mm, for example. Thus, first idler assembly 562, second idler assembly 564, and third idler assembly 566 may be configured to adjust tensions of the first transmission member 242, the second transmission member 246, and a third transmission member 254, respectively.

The one or more of the transmission members 242, 246, 254, and in some embodiments all of them, may include holes 474 spaced at defined intervals along a length thereof. These holes 474 are engageable with protrusions 476 formed on one or more of the driving members 440, 444, 452, and all in the depicted embodiments. Furthermore, protrusions 476 may be formed on one or more of the first driven member 332 and second driven member 336. Likewise, protrusions 476 may be formed on one or more of the idler members 156, 158, 160.

In operation, the drive assembly 238 is configured and adapted to cause rotation of the robot 106 about the shoulder axis 284 via driving the first drive motor 448 based on a signal from the controller 118. Extension and retraction of the second and third arms 231, 234 relative to the first arm 230 in an X-Y plane, may be accomplished via driving the second driven member 336. Coordinated motion of the robot 106 may be accomplished by driving the first driven member 332 and second driven member 336 simultaneously to carry out a desired motion profile of the end effector 235.

Figure 6:
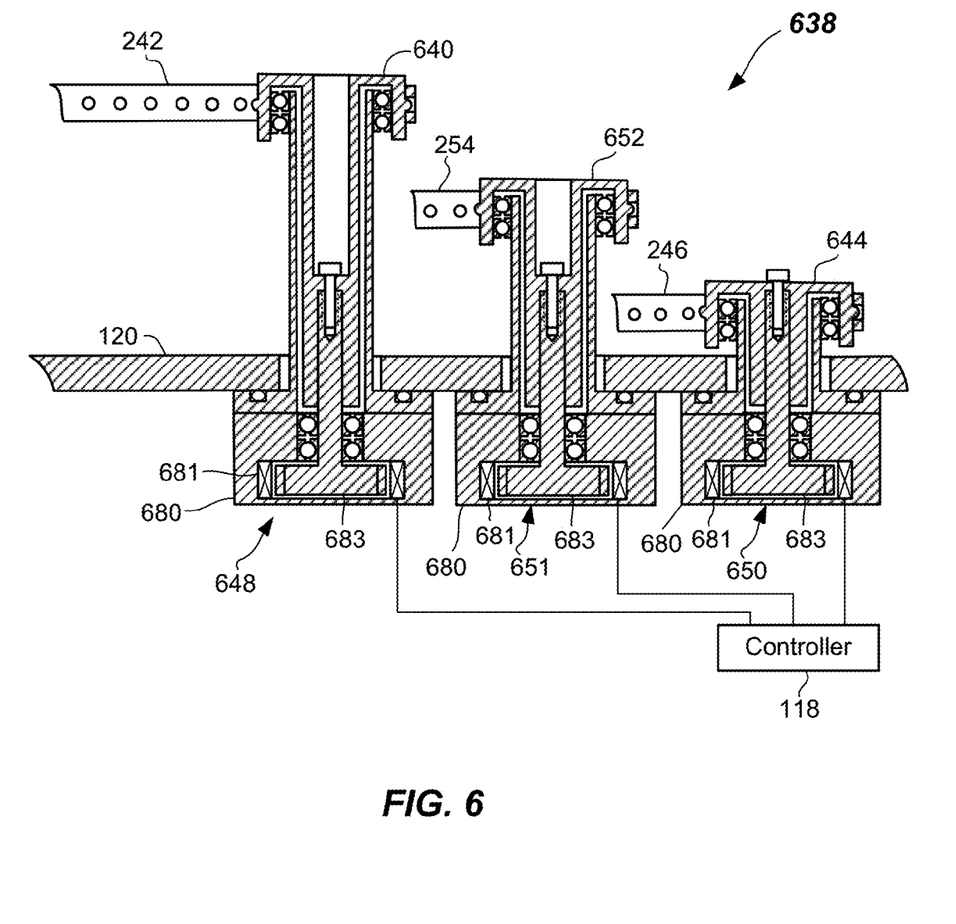
FIG. 6 illustrates a cross-sectioned side view of an alternative drive assembly of a robot assembly according to one or more embodiments.

In an alternate embodiment, the idler pulleys may be provided on one end of the base 120 and the drive motors may be individual drive motor that may include a common motor configuration. As shown in FIG. 6, the drive assembly 638 may include longitudinally-spaced and individually controllable first, second, and third drive motors 648, 650, 651, which can be adjusted in longitudinal position similarly to the idler assemblies 562, 564, 566, previously described so that tension in the first, second, and third transmission members 242, 246, 254 (e.g., metal drive belts) may be individually adjusted. The respective first, second, and third drive motors 648, 650, 651, which may each include a common construction, may include motor housing 680 fastened to the base 120, a stationary stator 681 supported in the motor housing 680 and electrically coupled to the controller 118, and a rotor 683 that may be coupled to the respective first, second and third driving members 640, 644, 652. Actuation of the first, second, and third drive motors 648, 650, 651 causes rotation of the respective first, second, and third driving members 640, 644, 652 and motion of the first, second, and third transmission members 242, 246, and 254. Each of the first, second, and third drive motors 648, 650, 651 may be individually controlled. Any type of suitable motor may be used. Encoders may be utilized to provide feedback to the controller 118.

Figure 7:
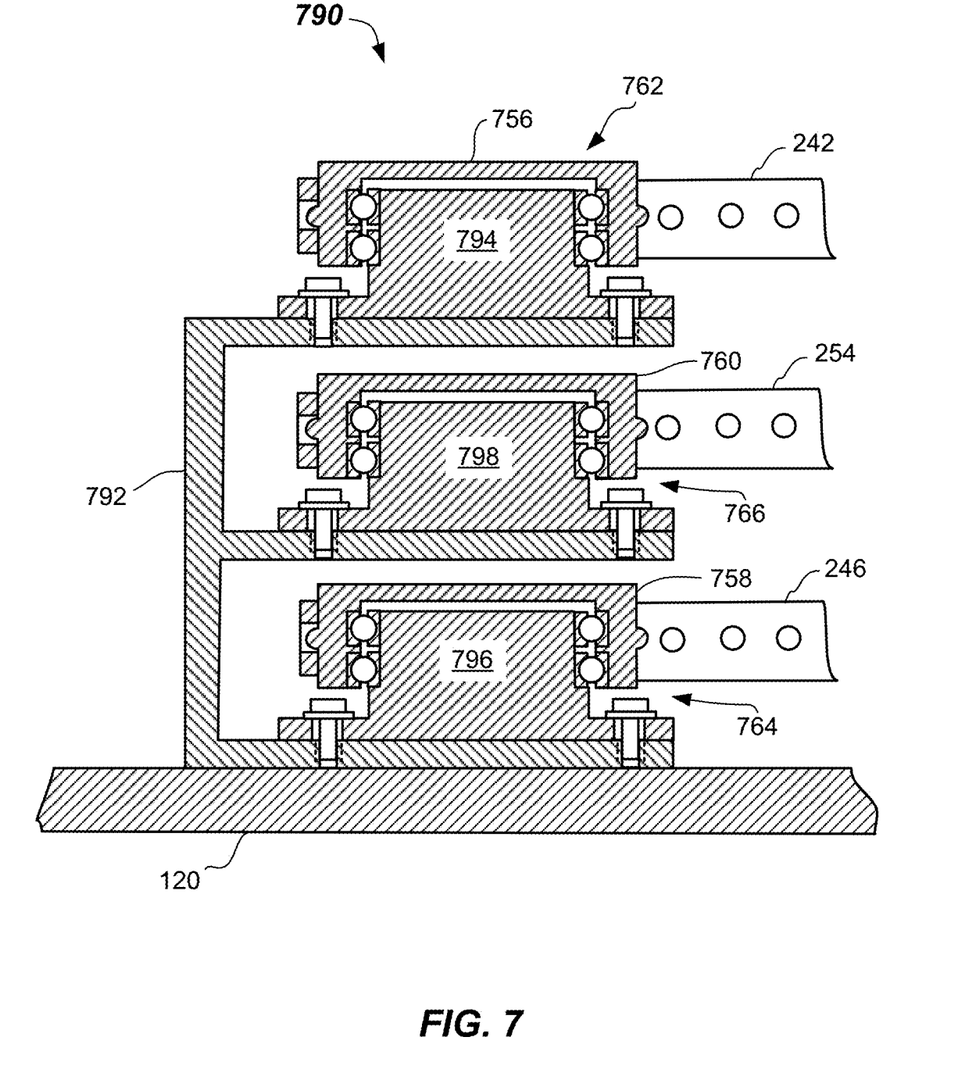
FIG. 7 illustrates a cross-sectioned side view of an alternative idler pulley assembly of a robot assembly according to one or more embodiments.

An additional embodiment of a stacked idler assembly 790 is shown in FIG. 7. The stacked idler assembly 790 may include a frame 792 fastened to, or integral with, the base 120, and first, second, and third idler assemblies 762, 764, 766 mounted to, and supported by, the frame 792. The first, second, and third idler assemblies 762, 764, 766 may include first, second, and third idler members 756, 758, 760 (e.g., pulleys). First, second, and third idler members 756, 758, 760 may be supported on first, second, and third support members 794, 796, 798 through bearings (e.g., ball bearings). The first, second, and third idler assemblies 762, 764, 766 may be identical to one another and may be generally co-axial. The frame 792 may be adjustable in longitudinal position relative to the base 120 in some embodiments via any suitable adjustment mechanism.

Figure 8:
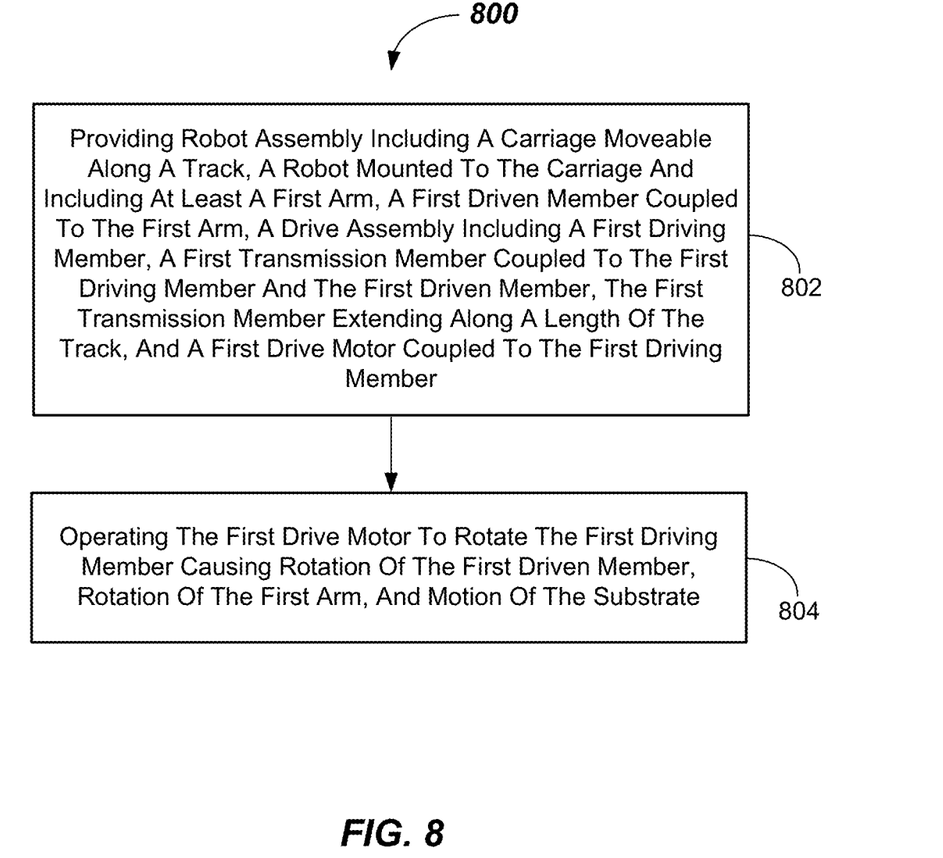
FIG. 8 illustrates a flowchart depicting a method of transporting a substrate within a substrate processing apparatus according to one or more embodiments.

A method of transporting a substrate (e.g., substrate 104) within a substrate processing apparatus 100 (e.g., electronic device manufacturing system) according to one or more embodiments of the present invention is provided in FIG. 8. According to the method 800, in 802, providing robot assembly (e.g., robot assembly 105) including a carriage (e.g., carriage 124) moveable along a track (e.g., track 122), a robot (e.g., robot 106) mounted to the carriage and including at least a first arm (e.g., first arm 230), a first driven member (e.g., first driven member 332) coupled to the first arm, a drive assembly (e.g., drive assembly 238, 638) including a first driving member (e.g., first driving member 440, 640), a first transmission member (e.g., first transmission member 242) coupled to the first driving member and the first driven member, the first transmission member extending along a length of the track, and a first drive motor (e.g., first drive motor 448, 648) coupled to the first driving member.

The method 800, in 804, includes operating the first drive motor (e.g., first drive motor 448, 648) to rotate the first driving member (e.g., first driving member 440, 640) causing rotation of the first driven member (e.g., first driven member 332), rotation of the first arm (e.g., first arm 230), and motion of the substrate (e.g., substrate 104).

Additional robot arms (e.g., second arm 231 and third arm 234, for example) may be driven remotely by the addition of one or more additional driving members (e.g., third driving member 452, 652) of the drive assembly (e.g., drive assembly 238, 638). Furthermore, independent rotation of a third arm may be provided by addition of even another driving member, driven member and internal pulleys, shafts and transmission members (not shown), such as described in U.S. Pat. No. 8,777,547. Translational motion of the carriage 124 may be carried out remotely by rotation of the second driving member (e.g., second driving member 444, 644) which, in turn, rotates the second transmission member 254 which is coupled to the carriage 124.

In one aspect, it will become apparent that embodiments of the present invention are adept at providing coordinated motion of the first arm 230, second arm 231, and third arm 234 and coupled end effector 235 in order to provide for motion of a substrate along any number of desired motion profiles.

Having shown the example embodiments, those skilled in the art will realize many variations are possible that will still be within the scope of the claimed invention. Therefore, it is the intention to limit the invention only as indicated by the scope of the claims.

The invention claimed is:

1. A robot assembly, comprising:
   a track;
   a carriage moveable along the track;
   a robot mounted to the carriage, the robot including at least a first arm, and a first driven member coupled to the first arm; and
   a drive assembly including
      a first driving member,
      a first transmission member coupled to the first driving member and the first driven member, the first transmission member extending along a length of the track, and
      a first drive motor coupled to the first driving member, the first drive motor configured to move the first driving member causing rotation of the first driven member and rotation of the first arm via the first transmission member.

2. The robot assembly of claim 1, comprising:
   a second driving member;
   a second transmission member coupled to the second driving member, the second transmission member coupled to the carriage and extending along a length of the track; and
   a second drive motor coupled to the second driving member, and configured to move the carriage along the track upon causing rotation of the second driving member via the second transmission member.

3. The robot assembly of claim 1, wherein the robot comprises a second arm, a third driven member coupled to the second arm, a third driving member, and a third transmission member coupled between the third driving member and the third driven member, the third transmission member extending along a length of the track.

4. The robot assembly of claim 1, comprising a third arm, an end effector coupled to the third arm, wherein the end effector is configured to carry a substrate.

5. The robot assembly of claim 1, comprising a first idler member coupled to the first transmission member and a second idler member coupled to a second transmission member.

6. The robot assembly of claim 5, comprising a third idler member coupled to a third transmission member.

7. The robot assembly of claim 1, comprising:
   a base, a drive assembly coupled to a first end of the base, and at least two idler members coupled to a second end of the base.

8. The robot assembly of claim 1, comprising a first idler assembly including:
   a first idler member rotatably mounted to a first idler housing and in contact with the first transmission member, the first idler housing being fastenable to a base at a first longitudinal position.

9. The robot assembly of claim 8, comprising a second idler assembly including:
   a second idler member rotatably mounted to a second idler housing and in contact with a second transmission member, the second idler housing being fastenable to the base at a second longitudinal position spaced from the first longitudinal position.

10. The robot assembly of claim 9, comprising a third idler assembly including:
    a third idler member rotatably mounted to a third idler housing and in contact with a third transmission member, the third idler housing being fastenable to the base at a longitudinal position spaced between from the first longitudinal position and the second longitudinal position.

11. The robot assembly of claim 1, comprising an idler assembly including longitudinal position adjustment capability.

12. The robot assembly of claim 1, comprising a first idler assembly, a second idler assembly, and a third idler assembly configured to adjust tensions of the first transmission member, a second transmission member, and a third transmission member.

13. The robot assembly of claim 1, comprising one or more idler pulley assemblies, each including an idler member rotatably mounted to a idler housing, wherein the idler housing is fastenable to a base and includes longitudinal position adjustment capability.

14. The robot assembly of claim 1, wherein the transmission member includes holes along a length thereof engageable with protrusions on the first driving member and first driven member.

15. The robot assembly of claim 1, comprising a second transmission member including holes along a length thereof engageable with protrusions on a second driving member.

16. The robot assembly of claim 1, comprising a third transmission member including holes along a length thereof engageable with protrusions on a third driving member and second driven member.

17. A substrate processing apparatus, comprising:
    a transfer chamber;
    a plurality of process chambers arranged along a length of the transfer chamber; and
    a robot assembly configured to move substrates to and from the process chambers, the robot assembly comprising:
       a track;
       a carriage moveable along the track;
       a robot mounted to the carriage, the robot including at least a first arm, and a first driven member coupled to the first arm;
       a drive assembly including
          a first driving member,
          a first transmission member coupled to the first driving member and the first driven member, the first transmission member extending along a length of the track, and
          a first drive motor coupled to the first driving member, and the first drive motor is configured to move the first driving member causing rotation of the first driven member and rotation of the first arm via the first transmission member.

18. The substrate processing apparatus of claim 17, comprising:
    a second driving member;
    a second transmission member coupled to the second driving member, the second transmission member coupled to the carriage and extending along a length of the track; and a second drive motor coupled to the second driving member, and configured to move the carriage along the track upon causing rotation of the second driving member via the second transmission member.

19. The substrate processing apparatus of claim 18, wherein the robot comprises a second arm, a third driven member coupled to the second arm, a third driving member, and a third transmission member coupled between the third driving member and the third driven member, the third transmission member extending along a length of the track.

20. A method of transporting a substrate within a substrate processing apparatus, comprising:
   providing robot assembly including a carriage moveable along a track, a robot mounted to the carriage and including at least a first arm, a first driven member coupled to the first arm, a drive assembly including a first driving member, a first transmission member coupled to the first driving member and the first driven member, the first transmission member extending along a length of the track, and a first drive motor coupled to the first driving member; and
   operating the first drive motor to rotate the first driving member causing rotation of the first driven member and rotation of the first arm via the first transmission member, in order to cause motion of the substrate.

* * * * *